United States Patent [19]

Yanagida

[11] Patent Number: 5,445,712
[45] Date of Patent: Aug. 29, 1995

[54] DRY ETCHING METHOD

[75] Inventor: Toshiharu Yanagida, Kanagawa, Japan

[73] Assignee: Sony Corporation, Tokyo, Japan

[21] Appl. No.: 29,534

[22] Filed: Mar. 11, 1993

[30] Foreign Application Priority Data

Mar. 25, 1992 [JP] Japan .................................. 4-067111

[51] Int. Cl.$^6$ .............................................. H01L 21/00
[52] U.S. Cl. ...................................... 156/662; 216/67; 216/79
[58] Field of Search ............... 156/643, 646, 662, 653, 156/651, 652, 667

[56] References Cited

FOREIGN PATENT DOCUMENTS 60-161623  8/1985  Japan .
2-278821  11/1990  Japan .
9003363   5/1990  Rep. of Korea .

OTHER PUBLICATIONS

"Plasma Etching of Si and SiO$_2$—The Effect of Oxygen Additions to CF$_4$ Plasmas", Mogat et al.; vol. 15; No. 2; Apr.–1978; Proceedings of the 24th National Symposium of The American Voluum Society; abstract only.
"Decomposition and Product Formation in CF$_4$/O$_2$ Plasma Etching Silicon in the Afterglow"; J. Appl. Phys., vol. 52; No. 1; Jan. 1981; Beenakker et al.; pp. 480–485.
"The Plasma Oxidation of CF$_4$ in a Tubular-Alumina Fast-Flow Reactor"; J. Appl. Phys.; vol. 50; No. 7; Jul. 1979; pp. 4982–4987; Smolinsky et al..
"Plasma Etching of Si and SiO$_2$ in SF$_6$–O$_2$ Mixtures"; J. Appl. Phys., vol. 52, No. 1; pp. 162–167; 1981; D'Agostino et al.

*Primary Examiner*—R. Bruce Breneman
*Assistant Examiner*—George A. Goudreau
*Attorney, Agent, or Firm*—Hill, Steadman & Simpson

[57] ABSTRACT

A dry etching method for etching an SiO$_2$ based material layer with a high etchrate, high selectivity, low damage, and pollution is disclosed. An etching gas containing a high-order fluorocarbon compound and an oxyhalogen compound is used. A main etchant is CF$_x^+$ dissociated in a large amount from the high-order fluorocarbon compound. On the other hand, the oxyhalogen compound, which has in a molecule one polarity functional group selected from carbonyl, thionyl, sulfuryl, nitrosyl, and nitryl, has the following effects: (1) a reduction in a deposit amount of carbonaceous polymer necessary for securing selectivity, by increasing chemical bond intensity, polymerization degree, and polarity of carbonaceous polymer derived from decomposition products of a resist mask; and (2) an increase in the etchrate by extracting O atoms from SiO$_2$ by reducive radicals such as SO* and NO* derived from the polarity functional group. For improving selectivity to an Si based underlying layer, it is effective to increase the content ratio of the oxyhalogen compound in an overetching process, or to use a sulfur based compound as well which is capable of producing a sulfur based deposit such as S$_2$F$_2$.

19 Claims, 1 Drawing Sheet

DRY ETCHING METHOD

BACKGROUND OF THE INVENTION

This invention relates to a dry etching method employed in such applications as production of semiconductor devices, and particularly to a dry etching method for etching a silicon compound layer which method exhibits high selectivity to a resist, high selectivity to a silicon underlying layer, high etch rate, little damage, and low pollution.

The recent trend toward larger-scale integration and higher performance of such semiconductor devices as VLSIs and ULSTs is becoming technically demanding of dry etching methods for etching a silicon compound layer represented by silicon oxide ($SiO_2$).

First, the mainstream of dry etching devices is transferring from the conventional batch processing to the single wafer processing for the following reasons: larger-scale integration expands the area of device chips, thereby increasing the diameter of wafers; patterns to be formed are made highly minute, so that uniform processing of the inside of wafer surface is required; and production with multiple varieties and small amounts as represented by ASIC is required. For maintaining productivity at a level similar to the conventional one with the single wafer processing, the etchrate per a wafer must be improved greatly.

Also, if impurity diffusion regions are shallow in the connection depth for attempting to achieve a high etchrate and minuteness, and if each variety of material layer is thin, an etching technique exhibiting higher selectivity to the underlying layer and less damage than the conventional technique is required. For instance, when contacts are formed in impurity diffusion regions formed in a semiconductor substrate, or source and drain regions of a PMOS transistor used as a resistive load element of SRAM, an $SiO_2$ interlayer insulation film is etched by using a silicon substrate or a polysilicon layer as the underlying layer.

Further, improvement of the selectivity to the resist is also an important task. This is because, in a submicron device, generation of even a little dimensional transformation difference due to retreat of the resist may not be allowed.

Conventionally, the etching of the $SiO_2$ based material layer has been carried out in a mode with high ionicity for cutting a rigid Si-O bond. Etching gases are typified by $CHF_3$ and $CF_4$, and the energy of incident ions of $CF_x^+$ released therefrom is used. However, for carrying out high-rate etching, it is necessary to increase the energy of incident ions, so that an etching reaction becomes proximate to a physical sputtering reaction. For this reason, the high etchrate and selectivity were constantly incompatible with each other.

Thus, usually, $H_2$ or a depositional hydrocarbon based gas is added to the etching gas, so as to increase the apparent C/F ratio (ratio of the number of carbon atoms to the number of fluorine atoms) in the etching reaction system. By thus promoting deposition of carbonaceous polymer generated competitively with the etching reaction, high selectivity is achieved.

The present applicant has proposed a dry etching method for etching a silicon compound layer using, instead of these conventional etching gases, a saturated or unsaturated high-order chain fluorocarbon based gas with the number of carbon being two or more, in the Japanese Patent KOKAI KOHO (Publication of Unexamined Patent Application) Ser. No. 3-276626. This is aimed at achieving high-rate etching by efficiently forming $CF_x^+$ by using a fluorocarbon based gas such as $C_2F_6$, $C_3F_8$, $C_4F_{10}$, and $C_4F_8$. However, if only the high-order chain fluorocarbon based gas is used singly, the amount of $F^*$ to be formed increases, and therefore, the selective ratio to the resist and the selective ratio to the underlying layer cannot be sufficiently large. For instance, when an $SiO_2$ layer on a silicon substrate is etched by using $C_3F_8$ as an etching gas, though a high etchrate may be achieved, the selective ratio to the resist is as low as about 1.3. Therefore, etching durability is insufficient, and a dimensional transformation difference is generated by retreat of a pattern edge. Also, since the selective ratio to silicon is approximately 4.2, problems remain in overetching durability as well.

Thus, in order to solve these problems, two-stage etching is carried out in the prior art, wherein etching by singly using the high-order chain fluorocarbon based gas is stopped slightly before the underlying layer is exposed, and then the remaining portion of the silicon compound layer is etched by adding a hydrocarbon based gas such as ethylene ($C_2H_4$) to the above-mentioned compound so as to promote deposition of carbonaceous polymer. This is aimed at increasing the apparent C/F ratio by supplying C atoms in the etching system and by consuming excessive $F^*$ with $H^*$ formed in a plasma so as to obtain HF.

However, under the status quo wherein design rules of semiconductor devices are becoming highly minute, the dimensional transformation difference from the etching mask is becoming hardly permitted. Even though the above-mentioned two-stage etching is carried out, it is necessary to improve further the selective ratio in etching on the first stage. In addition, it is anticipated that as the design rules of semiconductor devices become further minute from now on, the effects of particle pollution due to the carbonaceous polymer become serious. Therefore, it is desirable that the amount of the depositional gas such as a hydrocarbon based gas in etching on the second stage be reduced.

In view of such a status of the art, the present inventor has proposed a technique for etching a silicon compound by using an unsaturated chain fluorocarbon compound having at least one unsaturated bond in a molecule in a state in which the temperature of a substrate to be processed is controlled at 50° C. or lower, see the Japanese Patent KOKAI KOHO Ser. No. 4-170026. The above-mentioned unsaturated chain fluorocarbon compound is exemplified by octafluorobutene ($C_4F_8$) and hexafluoropropene ($C_3F_6$). Since, theoretically, these gases form two or more units of $CF_x^+$ from one molecule on dissociation due to electric discharges, $SiO_2$ may be etched at a high etchrate. Also, since the unsaturated bond exists in the molecule, it is easy to form highly active radicals by dissociation, whereby polymerization of the carbonaceous polymer may be promoted. In addition, deposition of the carbonaceous polymer may be promoted by controlling the temperature of the substrate being processed to be at 50° C. or lower.

With this technique, the selectivity to the resist and the selectivity to the silicon underlying layer were improved significantly, and the particle pollution was reduced as well.

As is described above, the dry etching method using the unsaturated chain fluorocarbon compound which was previously proposed by the present inventor had extremely great advantages compared with conventional techniques. However, since these advantages are based mainly on improvement of the selectivity, there still remains the condition of particle pollution to be improved. In short, since this technique is not different at all from the conventional ones in terms of the mechanism for securing the selective ratio which is achieved by the deposition of the carbonaceous polymer proceeding competitively with the etching reaction, if the number of processing steps becomes large, the carbonaceous polymer will be deposited in the etching chamber, and the particle level will deteriorate. Accordingly, even though the particle pollution is reduced, it is merely such improvement as a reduction in frequency of maintenance for cleaning the etching chamber.

OBJECTS AND SUMMARY OF THE INVENTION

It is the object of the present invention to provide a dry etching method for etching a silicon compound layer which method is superior in such characteristics as high etchrate, high selectivity, low damage, and particularly low pollution.

The point of the present invention is in achieving sufficiently high selectivity to the resist and selectivity to the underlying layer despite a small amount of deposition, by reinforcing the film property of the carbonaceous polymer itself.

In the present invention, as a method of reinforcing the film property of the carbonaceous polymer itself, halogen compounds containing in a molecule a halogen atom and a functional group selected from carbonyl ($>C=O$), thionyl ($>S=O$), sulfuryl ($>SO_2$), nitrosyl ($-N=O$), and nitryl ($-NO_2$), is added to the conventionally known fluorocarbon compound or the fluorocarbon compound previously proposed by the present invention.

The above-mentioned functional group may have a polarized structure with C atom, S atom, or N atom being electro-positive and with O atom being electro-negative, thereby having high polymerization acceleration activity. Accordingly, since such functional groups or atomic groups derived therefrom are present in a plasma, the polymerization degree of the carbonaceous polymer rises, and thus the durability to incident ions and radical attacks may be improved. In addition, it has been revealed by the recent studies that if the above-mentioned functional groups are introduced into the carbonaceous polymer, higher chemical and physical stabilization may be obtained than in the conventional carbonaceous polymer with a structure being simple repetition of —$CF_2$—. It is understood that this is because the polarity of the carbonaceous polymer increases with the introduction of the functional groups, thereby increasing the electrostatic adsorption force of the carbonaceous polymer onto a wafer negatively electrified during the etching. Accordingly, only a small amount of deposition of the carbonaceous polymer is necessary for achieving high selectivity to a resist material or an $SiO_2$ based material. Thus, a thorough reduction of the pollution compared with the conventional technique can be achieved.

The above-mentioned functional groups also contribute roan increase in the etchrate. That is, radicals which can be released from the functional groups, such as $CO^*$, $SO^*$, $SO_2^*$, $NO^*$, and $NO_2^*$, have a reductive action, and therefore can extract O atoms from $SiO_2$. This is understandable from the fact that the interatomic bond energy calculated from the heat of generation of a two-atom molecule is 257 kcal/mol with a C-O bond, 125 kcal/mol with an S-O bond, and 151 kcal/mol with an N-O bond, each of which is larger than 111 kcal/mol of an Si-O bond in a crystal. Si atom, after O atom is extracted, is combined with halogen radicals dissociated from the halogen compound, and is quickly removed in the form of halide. In short, with the present invention, it becomes possible to cut the Si-O bond, not only by the conventional physical sputtering action with $CF_x^+$ions, but also by the chemical action. In addition, the halogen compound used in the present invention exercises no action on the resist material and the underlying Si based material, so that the etchrate at which these materials are etched is kept low.

On the other hand, another main component of the etching gas in the present invention is a fluorocarbon compound.

The fluorocarbon compound which is particularly recommended is a so-called high-order fluorocarbon compound $C_mF_n$ with the number of C atoms being two or larger. The high-order fluorocarbon compound may be either saturated or unsaturated, that is, the number of F atoms $n \leq 2m+2$. Also, the carbon skeleton of the high-order fluorocarbon compound may be straight chain, branching or cyclic. Theoretically, two or more $CF_x^*$ can be released from one molecule of the high-order fluorocarbon compound. Thus, the absolute amount of $CF_x^*$ in the plasma is greater than in the case of using the conventional gas such as $CF_3H$ or $CF_2H_2$, under the same gas pressure, and thereby the high-rate etching can be realized.

In this manner, if the halogen compound is added to the high-order fluorocarbon compound which is inherently superior in a high etchrate, the multiplier effect of ion sputtering due to the large amount, of $CF_x^*$ and extraction of O atoms due radicals such as $CO^*$, $SO^*$, $SO_2^*$, $NO^*$ and $NO_2^*$ makes it, possible to etch the silicon compound layer even without such high energy of incident ions as in the conventional manner.

Although the present invention is based on the preceding idea other methods aimed at a further reduction in pollution and damage are proposed.

One of these methods is to divide the etching process into two processes, that, is, a just etching process for etching until the underlying material layer is exposed and an overetching process thereafter, and then to increase the concentration of the halogen compound in the etching gas composition in the latter overetching process. Thus, etching in the vicinity of a boundary surface with the underlying layer in the silicon compound layer proceeds by a mechanism consisting mainly of an extraction reaction of O atoms, whereby a further reduction in the pollution and damage may be attained.

Another method of further achieving a thorough reduction in the pollution and damage is to switch the composition of etching gas in the overetching process to a mixed composition of the halogen compound and a sulfur based compound capable of releasing sulfur in a plasma on dissociation due to electric discharges. That is, since the high etchrate is not particularly required in the overetching process, the use of the fluorocarbon compound avoided, and deposition of carbonaceous polymer is excluded.

A particularly preferred compound as the sulfur based compound used in this method is at least one kind of sulfur fluoride selected from $S_2F_2$, $SF_2$, $SF_4$, and $S_2F_{10}$. The sulfur fluoride is a compound for etching an $SiO_2$ based material layer which the present applicant previously proposed in the Japanese Patent KOKAI KOHO Ser. No. 4-84427. The etchants in this case are $SF_x^+$ and $F^*$. The sulfur fluoride, having a larger S/F ratio (the ratio of the number of S atoms to the number of F atoms in one molecule) compared with $SF_6$ used practically as a conventional etching gas, can release free sulfur (S) in a plasma on dissociation due to electric discharges. This S is deposited on a surface of a wafer when the temperature of the wafer is controlled at the room temperature or lower. At this time, on the surface of the $SiO_2$ material layer, S supplied with O atoms is removed in the form of $SO_x$. However, S is deposited on the surface of the resist material and Si based material or on sidewalls of the pattern, and thus contributes to the achievement of high selectivity and high anisotropy.

If the sulfur fluoride is used in the overetching process, the etching of the $SiO_2$ material layer partly remaining on the wafer proceeds with ion sputtering by $SF_x^+$ and the extraction of O atoms by radicals such as $CO^*$, $SO^*$, $SO_2^*$, $NO^*$, and $NO_2^*$. Otherwise, it is also possible to reduce the contribution of $SF_x^+$, and to set conditions for extraction of O atoms as the main factor. If the underlying Si based material layer is exposed, S is deposited thereon, so as to prevent erosion of the Si based material layer by $F^*$. Particularly when a halogen compound having nitrosyl and nitryl is used, S released from the sulfur fluoride and N released from the halogen compound are combined with each other, thereby forming a sulfur nitride based compound, mainly polythiazyl $(SN)_x$. The sulfur nitride based compound realizes more effective protection of the sidewall is and the Si based material layer than S.

Further, since the deposited S may be easily sublimated when the wafer is heated to about 90° C. or higher after etching. Since the sulfur nitride based compound may be decomposed OF sublimated at about 130° C. or higher, no particle pollution is left on the wafer. Accordingly, the etching superior in all characteristics of high etchrate, high selectivity, low pollution and low damage becomes possible.

The achievement of such etching certainly contributes to improvement of reliability and yield of semiconductor devices to be produced, and also contributes greatly to improvement of throughput and economy such as a reduction in maintenance frequency for etching devices.

BRIEF DESCRIPTION OF THE DRAWINGS

FIG. 1a shows a state in which a resist pattern is formed on an $SiO_2$ interlayer insulation film. FIG. 1b shows a state in which a contact hole is opened.

DETAILED DESCRIPTION OF THE INVENTION

Preferred embodiments of the present invention are explained hereinbelow.

EXAMPLE 1

In the present example, the present invention is applied to contact hole processing, in which an $SiO_2$ interlayer insulation film was etched by using a mixed gas of octafluorocyclobutane ($c$-$C_4F_8$) and carbonyl fluoride ($COF_2$). The process is explained by referring to FIGS. 1a and 1b.

Figure 1A:
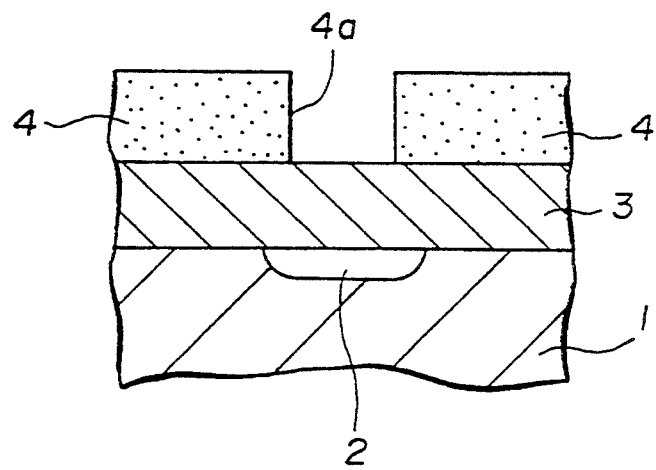
FIGS. 1a and 1b are schematic cross-sectional views showing an example of processes of the present invention applied to contact hole processing in order.

A wafer used as a sample in the present example is comprised of an $SiO_2$ interlayer insulation film 3 formed on a single-layer silicon substrate 1 with an impurity diffusion region 2 formed therein in advance, and a resist pattern 4 as an etching mask for the $SiO_2$ interlayer insulation film 3. The resist pattern 4 has an aperture 4a, as shown in FIG. 1a.

The wafer was set on a wafer setting electrode of a magnet ton RTE (reactive ion etching) apparatus. Since the wafer setting electrode has a cooling pipe housed therein, the temperature of the wafer during the etching can be controlled at the room temperature or below by supplying coolants to the cooling pipe from a cooling device such as a chiller connected to the outside of the apparatus. The $SiO_2$ interlayer insulation film 3 was etched, for instance, under the following conditions:

| | |
|---|---|
| $c$-$C_4$-$F_8$ flow rate | 35 SCCM |
| COF 2 f low rate | 15 SCCM |
| gas pressure | 2.0 Pa |
| RF power density | 2.0 W/cm$^2$ (13.56 MHz) |
| magnetic field intensity | $1.50 \times 10^{-2}$ T (= 150 G) |
| wafer temperature | $-30°$ C. (with the use of ethanol coolant) |

Figure 1B:
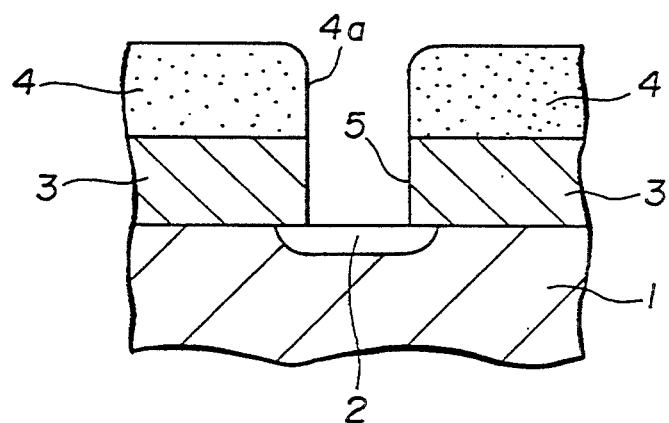

In this etching process, since an extraction reaction of O atoms due to $CO^*$ dissociated from $COF_2$ promoted etching of the $SiO_2$ by $CF_x^+$ on a surface of the $SiO_2$ interlayer insulation film 3 exposed into the aperture 4a, the etching proceeded at such a high rate as 950 nm/min. despite the absence of conditions for excessive energy of incident ions. As a result, a contact hole 5 of anisotropic shape was formed quickly, as shown in FIG. 1b.

In the present example, though carbonaceous polymer, not shown, was deposited on the resist pattern 4 and the impurity diffusion region 2, the deposit amount was far smaller than in the conventional process because the relative content ratio of $c$-$C_4$-$F_8$ was reduced by adding $COF_2$ to the etching gas. Despite the small amount of deposition, however, high selectivity was achieved, and none of the following defects was found, that is, a reduction in the film thickness of the resist pattern, retreat of a pattern edge, and destruction of shallow connection due to overetching. The selective ratio to the resist was about 7, and the selective ratio to the silicon was about 30. The high selectivity is a comprehensive result Of the following effects: that the polymerization degree of carbonaceous polymer was raised by contribution of $CO^*$; that even a small amount of the carbonaceous polymer, reinforced by introduction of carbonyl, exhibited high etching durability; that consequently, energy of incident ions necessary for securing anisotropy was reduced; and that a radical reaction of $F^*$ was controlled by cooling the wafer, thereby relatively reducing the etchrate at which the resist material and the silicon based material were etched mainly in a radical mode.

Since the deposit amount of the carbonaceous polymer decreased, the frequency of maintenance necessary for cleaning an etching chamber was reduced, whereby throughput was improved.

EXAMPLE 2

In the present example, similar contact hole processing is carried out by using a c-$C_4$-$F_8$/$SOF_2$ (thionyl fluoride) mixed gas.

A sample wafer used in this example is a similar one to the wafer previously shown in FIG. 1a. An $SiO_2$ interlayer insulation film 3 was etched under the same conditions as in example 1 except, for the use of $SOF_2$ instead of $COF_2$.

In this etching process, since an extraction reaction of O atoms due to $SO^*$ dissociated from $SOF_2$ promoted etching of the $SiO_2$ by $CF_x^+$, the etching proceeded at such a high rate as 950 nm/min. despite the absence of conditions for excessive energy of incidentions. As a result, a contact hole 5 of highly anisoitropic shape was formed quickly, as shown in FIG. 1b.

In the present example as well, despite a relatively small amount of the deposition of the carbonaceous polymer, high selective ratios of about 7 to a resist pattern 4 and of about 30 to a single-crystal silicon substrate were achieved. The achievement, of the high selective ratios is a comprehensive result of the following effects: that the polymerization degree of the carbonaceous polymer was raised by contribution of $CO^*$; that even a small amount of the carbonaceous polymer, reinforced by introduction of thionyl, exhibited high etching durability; that consequently, energy of the incident ions necessary for securing anisotropy was reduced; and that a radical reaction of $F^*$ was controlled by a cooling the wafer, thereby relatively reducing the etchrate at which the resist material and the silicon based material were etched mainly in a radical mode.

EXAMPLE 3

In the present example, a similar contact hole processing is carried out by using a c-$C_4$-$F_8$/NOF (nitrosyl fluoride) mixed gas.

A sample wafer used in this example is a similar one to the wafer previously shown in FIG. 1a. An $SiO_2$ interlayer insulation film 3 was etched under the same conditions as in example 1 except for the use of NOF instead of $COF_2$.

In this etching process, since an extraction reaction of O atoms due to $SO^*$ dissociated from NOF promoted etching of the $SiO_2$ by $CF_x^+$, the etching proceeded at such a high rate as 900 nm/min. despite the absence of conditions for excessive energy of incident ions. As a result, a contact hole 5 of highly anisotropic shape was formed quickly, as shown in FIG. 1b.

In the present example, the selective ratio to the resist was about 7, and the selective ratio to silicon was about 30.

EXAMPLE 4

In the present example, similar contact hole processing was carried out, in which an etching process of an $SiO_2$ interlayer insulation film using a c-$C_4F_8$/$COF_2$ mixed gas was divided into two stages of a just etching process and an overetching process, with the content ratio of $COF_2$ being relatively increased in the latter process, thereby further improving the selectivity. The process is explained by referring to the aforementioned FIGS. 1a and 1b.

A wafer used as a sample in the present example is similar to the one shown in FIG. 1a. The wafer was set on the magnet ton RIE apparatus, and an $SiO_2$ interlayer insulation film 3 was etched slightly before an impurity diffusion region 2 was substantially exposed, for instance, under the following conditions:

| | |
|---|---|
| c-$C_4$-$F_8$ flow rate | 35 SCCM |
| $COF_2$ flow rate | 15 SCCM (content ratio in the etching gas: 30%) |
| gas pressure | 2.0 Pa |
| RF power density | 2.0 W/cm$^2$ (13.56 MHz) |
| magnetic field intensity | 1.5 × 10$^{-2}$ T |
| wafer temperature | 0° C. |

Figure 2:
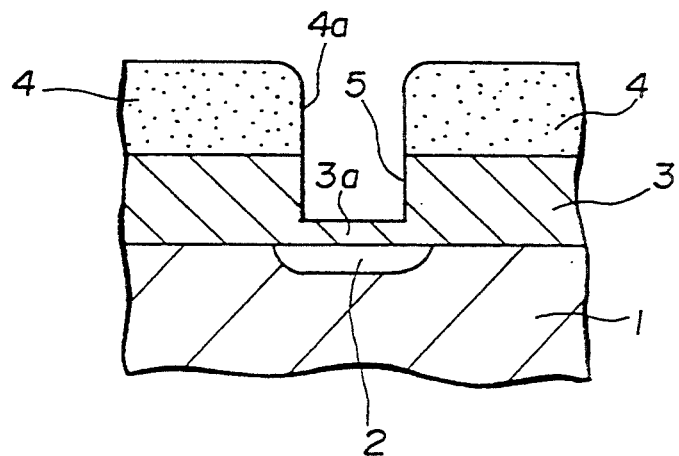
FIG. 2 is a schematic cross-sectional view showing another example of the processes of the present invention applied to contact hole processing wherein the contact hole is formed to a halfway portion.

The etching mechanism in the just etching process substantially similar to the one described above in example 1. The end-point detection was carried out when the intensity of the emission light spectrum of $CO^*$ at 483.5 nm or the intensity of the emission light spectrum of $SiO_2$ at 777 nm started to change. This point corresponded to the time when an underlying impurity diffusion region 2 began to be exposed in a portion of the wafer. However, in other portions on the wafer, a contact hole 5 was formed only to a halfway portion, and a remaining portion 3a of the $SiO_2$ interlayer insulation film 3 was left on the bottom, as shown in FIG. 2.

Thus, overetching was carried out to remove the remaining portion 3a, by changing the etching conditions as follows:

| | |
|---|---|
| c-$C_4$-$F_8$ flow rate | 20 SCCM |
| $COF_2$ flow rate | 30 SCCM (content ratio in the etching gas: 60%) |
| gas pressure | 2.0 Pa |
| RF power density | 1.2 W/cm$^2$ (13.56 MHz) |
| magnetic field intensity | 1.5 × 10$^{-2}$ T |
| wafer temperature | 0° C. |

In the overetching process, the energy of incident ions was reduced by a reduction in the RF power density, and etching was carried out mainly by the chemical extraction reaction of O atoms due to $CO^*$. Also, since the content ratio of c-$C_4$-$F_8$ was decreased in the vicinity of the boundary surface with the impurity diffusion region 2, the deposit amount of the carbonaceous polymer on the surface of the impurity diffusion region 2 was reduced.

As a result, despite the higher temperature of the wafer than in example 1, a contact hole 5 of anisotropic shape, as shown in FIG. 1b, exhibiting high selectivity, low damage, and low pollution was formed.

EXAMPLE 5

In the present example, similar contact hole processing was carried out, in which an etching process of an $SiO_2$ interlayer insulation film using a c-$C_4F_8$/$SO_2F_2$ (sulfuryl fluoride) mixed gas was divided into two stages of a just etching process and an overetching process, with the content ratio of $SO_2F_2$ being relatively increased in the latter process, thereby further improving selectivity.

The etching conditions in the present example are all similar to those in example 4, except for the use of $SO_2F_2$ instead of $COF_2$. However, the end-point detection in the just etching was carried out when the intensity of the emission light spectrum of $SO^*$ at 306 nm, 317 nm, or 327 nm, or the intensity of the emission light spectrum of SiF* at 777 nm started to increase.

In the just etching process of the present example, high-rate etching proceeded by an ion-assisted reaction by $CF_x{}^+$ and extraction of O atoms due to SO*, and in the overetching process, etching with high selectivity and low damage proceeded by a chemical process consisting mainly of the extraction of O atoms.

EXAMPLE 6

In the present example, similar contact hole processing was carried out, in which the etching process of an $SiO_2$ interlayer insulation film using a $c$-$C_4$-$F_8$/NOF mixed gas was divided into two stages of a just etching process and an overetching process, with the content ratio of NOF being relatively increased in the latter process, thereby further improving selectivity.

The etching conditions in the present example are all similar to those in example 4, except for the use of NOF instead of $COF_2$. However, the end-point detection of the just etching process was carried out when the intensity of the emission light spectrum of $SiO_2$ at 777 nm started to increase.

In the just etching process of the present example, high-rate etching proceeded by an ion-assisted reaction due to $CF_x{}^+$ and extraction of O atoms due to NO*, and in the overetching process, etching with high selectivity and low damage proceeded by a chemical process consisting mainly of the extraction of O atoms.

EXAMPLE 7

In the present example, similar contact hole processing was carried out, in which a thorough reduction in the pollution was attempted by using a $c$-$C_4$-$F_8$/$COF_2$ mixed gas in a just etching process and an $S_2F_2$/$COF_2$ mixed gas in an overetching process.

First, a wafer as shown in FIG. 1a was set on the RIE apparatus, and an $SiO_2$ interlayer insulation film 3 was etched by the just etching, for instance, under the following conditions:

| | |
|---|---|
| $c$-$C_4$-$F_8$ flow rate | 35 SCCM |
| $COF_2$ flow rate | 15 SCCM |
| gas pressure | 2.0 Pa |
| RF power density | 2.2 W/cm² (13.56 MHz) |
| magnetic field intensity | $1.5 \times 10^{-2}$ T |
| wafer temperature | 0° C. |

Then, the overetching was carried out for removing a remaining portion 3a of the $SiO_2$ interlayer insulation film 3, for instance, under the following conditions:

| | |
|---|---|
| $S_2F_2$ flow rate | 35 SCCM |
| $COF_2$ flow rate | 15 SCCM |
| gas pressure | 2.0 Pa |
| RF power density | 1.0 W/cm² (13.56 MHz) |
| magnetic field intensity | $1.5 \times 10^{-2}$ T |
| wafer temperature | 0° C. |

In the overetching process, the etching reaction proceeded on the basis of the extraction reaction of O atoms by decreasing the energy of incident ions, and at the same time, S dissociated from $S_2F_2$ is deposited on a resist pattern 4 and an impurity diffusion region 2. Therefore, high selectivity was achieved without any deposition of the carbonaceous polymer in the vicinity of the boundary surface with the impurity diffusion region 2.

Meanwhile, the deposited S could easily be removed by heating the wafer to about 90° C. after etching, or by sublimation or combustion in washing of the resist pattern 4. The deposited S in the etching chamber could be removed in a similar manner. Accordingly, a further thorough reduction in the pollution was achieved in the present example. Thus, the yield of devices and throughput were improved.

EXAMPLE 8

In the present example, similar contact hole processing was carried out, in which a thorough reduction in the pollution and damage was attempted by using a $C_3F_6$/$C_2F_2O_2$ (oxalyl fluoride) mixed gas in a just etching process, and an $S_2F_2$/$C_2F_2O_2$ mixed gas in an overetching process.

First, an $SiO_2$ interlayer insulation film 3 was etched by the just etching, using a wafer as shown in FIG. 1a, for instance, under the following conditions.

| | |
|---|---|
| $C_3F_6$ flow rate | 35 SCCM |
| $C_2F_2O_2$ flow rate | 15 SCCM |
| gas pressure | 2.0 Pa |
| RF power density | 1.8 W/cm² (13.56 MHz) |
| magnetic field intensity | $1.5 \times 10^{-2}$ T |
| wafer temperature | 0° C. |

At this time, since the above-mentioned $C_2F_2O_2$ is liquid at the normal temperature, it was introduced into an etching chamber after being gasified by He gas bubbling.

Then, a remaining portion 3a of the $SiO_2$ interlayer insulation film 3 was etched the overetching, for instance, under the following conditions:

| | |
|---|---|
| $S_2F_2$ flow rate | 35 SCCM |
| $C_2F_2O_2$ flow rate | 15 SCCM |
| gas pressure | 2.0 Pa |
| RF power density | 0.8 W/cm² (13.56 MHz) |
| magnetic field intensity | $1.5 \times 10^{-2}$ T |
| wafer temperature | 0° C. |

The $C_2F_2O_2$ (FOC-COF) used in the present example, having two carbonyls in one molecule, exhibits high polymerization acceleration effects of the carbonaceous polymer, and effectively reinforces film property. Accordingly, despite the lower energy of incident ions than in any of the preceding examples, etching with high selectivity, high anisotropy, and low damage was carried out.

EXAMPLE 9

In the present example, similar contact hole processing was carried out, in which a thorough reduction in the pollution was attempted by using a $c$-$C_4$-$F_8$/$SOF_2$ mixed gas in a just etching process, and an $S_2F_2$/$SOF_2$ mixed gas in an overetching process.

The etching conditions in the present example are all similar to those in example 7, except for the use of $SOF_2$ instead of $COF_2$.

In the just etching process of the present example, high-rate etching proceeded by an Ion-assisted reaction due to $CF_x{}^+$ and extraction of O atoms. In the overetching process, etching with high selectivity, low pollution, and low damage proceeded by extraction of O atoms and deposition of S.

EXAMPLE 10

In the present example, similar contact hole processing was carried out, in which a thorough reduction in the pollution was attempted by using a c-C$_4$F$_8$/NO$_2$F (nitryl fluoride) mixed gas in a just etching process, and an S$_2$F$_2$/NO$_2$F mixed gas in an overetching process.

First, an SiO$_2$ interlayer insulation film 3 was etched by the just etching, using a wafer as shown in FIG. 1a, for instance, under the following conditions.

| | |
|---|---|
| c-C$_4$-F$_8$ flow rate | 35 SCCM |
| NO$_2$F flow rate | 15 SCCM |
| gas pressure | 2.0 Pa |
| RF power density | 2.0 W/cm$^2$ (13.56 MHz) |
| magnetic field intensity | 1.5 × 10$^{-2}$ T |
| wafer temperature | 0° C. |

In the just etching process, high-rate etching was carried out by an ion-assisted reaction due to CF$_x$$^+$ and extraction of O atoms due to NO* and NO$_2$*.

Then, the overetching was carried out for etching a remaining portion 3a of the SiO$_2$ interlayer insulation film 3, for instance, under the following conditions:

| | |
|---|---|
| S$_2$F$_2$ flow rate | 25 SCCM |
| NO$_2$F flow rate | 25 SCCM |
| gas pressure | 2.0 Pa |
| RF power density | 0.8 W/cm$^2$ (13.56 MHz) |
| magnetic field intensity | 1.5× 10$^{-2}$ T |
| wafer temperature | 0° C. |

In the overetching process, while an etching reaction was carried out mainly by extraction of O atoms due to NO* and NO$_2$*, a sulfur nitride based compound consisting mainly of (SN)$_x$ was deposited by a reaction of S released from S$_2$F$_2$ and N released from NO$_2$F, thereby exhibiting rigid protection effects for sidewalls and the underlying layer. As a result, the selective ratios to the resist and to silicon were improved significantly.

Although the present invention has been explained on the basis of the ten examples, the present invention is not limited to these examples at all.

For instance, instead of c-C$_4$F$_8$ and C$_3$F$_6$, which were employed as fluorocarbon compounds in the above examples, chain fluorocarbon compounds having an unsaturated bond such as C$_3$F$_6$, previously proposed by the present inventor in the Japanese Patent KOKAI KOHO Ser. No. 4-170026, or unsaturated or saturated cyclic fluorocarbon compounds such as c-C$_4$F$_6$ and c-C$_5$F$_{10}$, also previously proposed by the present inventor in the Japanese Patent KOKAI KOHO Ser. No. 4-258117, may be used.

Among the halogen compounds used in the present invention, those having one carbonyl in a molecule other than the above-mentioned COF$_2$ are, for example, COCl$_2$ (carbonyl chloride or phosgene), COBr$_2$ (carbonyl bromide; liquid), COClF (carbonyl chloride fluoride), COBrF (carbonyl bromide fluoride), and COIF (carbonyl iodide fluoride; liquid). Those having two carbonyls in a molecule other than the above-mentioned C$_2$F$_2$O$_2$ are C$_2$Cl$_2$O$_2$ (oxalyl chloride; liquid) and C$_2$Br$_2$O$_2$ (oxalyl bromide; liquid).

The halogen compounds having one thionyl in a molecule other than the above-mentioned SOF$_2$ are SOF$_4$ (thionyl tetrafluoride), SOCl$_2$ (thionyl chloride; liquid), SOBr$_2$ (thionyl bromide; liquid), and SOClBr (thionyl chloride bromide; liquid).

The halogen compounds having one sulfuryl in a molecule other than the above-mentioned SO$_2$F$_2$ are SO$_2$Cl$_2$ (sulfuryl chloride; liquid), SO$_2$ClF (sulfuryl chloride fluoride), and SO$_2$BrF (sulfuryl bromide fluoride; liquid).

The halogen compounds having one nitrosyl in a molecule other than the above-mentioned NOF are NOCl (nitrosyl chloride) and NOBr (nitrosyl bromide; liquid).

In addition, the halogen compounds having one nitryl in a molecule other than the above-mentioned NO$_2$F are NO$_2$Cl (nitryl chloride) and NO$_2$Br (nitryl bromide).

The above compounds with the description of "liquid" after their names are liquid at the normal temperature, and the compounds without the description are all gaseous.

Although S$_2$F$_2$ was used as sulfur fluoride in the above examples, other sulfur fluorides determined by the present invention, such as SF$_2$, SF$_4$, and S$_2$F$_{10}$, may be used to obtain the basically same results.

To the etching gas used in the present invention, O$_2$ may be added for the purpose of controlling the etch rate, or a preferred amount of rare gases such as He and Ar may be added for sputtering effects, dilution effects, and cooling effects.

The material layer to be etched is not limited to the above-mentioned SiO$_2$ interlayer insulation film, but may be other SiO$_2$based material layers, such as PSG, BSG, BPSG, AsSG, AsPSG, and AsBSG, and may be Si$_x$N$_y$.

Needless to say, other factors such as the structure of the wafer, the etching apparatus to be used, and the etching conditions are changeable.

What is claimed is:

1. A dry etching method comprising plasma etching a silicon compound layer by using an initial etching gas containing a mixture of fluorocarbon compound and a halogen compound having a molecule formed of a halogen atom and at least one kind of functional group selected from the group consisting of carbonyl, thionyl, sulfuryl, nitrosyl, and nitryl.

2. The dry etching method as claimed in claim 1 wherein said halogen compound is at least one kind of oxyhalogen compound selected from the group consisting of carbonyl fluoride, carbonyl chloride, carbonyl bromide, oxalyl fluoride, oxalyl chloride, oxalyl bromide, thionyl fluoride, thionyl chloride, thionyl bromide, sulfuryl fluoride, sulfuryl chloride, sulfuryl bromide, nitrosyl fluoride, nitrosyl chloride, nitrosyl bromide, nitryl fluoride, nitryl chloride, and nitryl bromide.

3. The dry etching method as claimed in claim 1 wherein said fluorocarbon compound has a general formula C$_m$F$_n$, with m and n being natural numbers showing the number of atoms and satisfying conditions of m≧2, n≦2m+2.

4. The dry etching method as claimed in claim 1 wherein said silicon compound layer consists of a silicon oxide based material or a silicon nitride based material.

5. A dry etching method comprising plasma etching a silicon oxide interlayer insulation film on a silicon substrate via a resist mask by using an initial etching gas containing a mixture of a fluorocarbon compound and an oxyhalogen compound having a molecule formed by a halogen atom and at least one kind of functional group selected from the group consisting of carbonyl, thionyl, sulfuryl, nitrosyl, and nitryl, said fluorocarbon compound shown by a general formula $C_mF_n$, with m and n being natural numbers showing the number of atoms and satisfying conditions of $m \geq 2$, $n \leq 2m+2$.

6. A dry etching method comprising the steps of a first plasma etching process for etching a silicon compound layer substantially to a depth less than a thickness thereof by using an etching gas containing a fluorocarbon compound and a halogen compound having a molecule with a halogen atom and at least one kind of functional group selected from the group consisting of carbonyl, thionyl, sulfuryl, nitrosyl, and nitryl, and an overetching process for plasma etching a remaining portion of said silicon compound layer by using an etching gas with a higher content ratio of said halogen compound to said fluorocarbon compound than in said first plasma etching process.

7. The dry etching method as claimed in claim 6 wherein said halogen compound is at least one kind of oxyhalogen compound selected from the group consisting of carbonyl fluoride, carbonyl chloride, carbonyl bromide, oxalyl fluoride, oxalyl chloride, oxalyl bromide, thionyl fluoride, thionyl chloride, thionyl bromide, sulfuryl fluoride, sulfuryl chloride, sulfuryl bromide, nitrosyl fluoride, nitrosyl chloride, nitrosyl bromide, nitryl fluoride, nitryl chloride, and nitryl bromide.

8. The dry etching method as claimed in claim 6 wherein said fluorocarbon compound is shown by a general formula $C_mF_n$, with m and n being natural numbers showing the number of atoms and satisfying conditions of $m \geq 2$, $n \leq 2m+2$.

9. The dry etching method as claimed in claim 6 wherein said silicon compound layer consists of a silicon oxide based material or a silicon nitride based material.

10. A dry etching method comprising the steps of a first plasma etching process for etching a silicon oxide interlayer insulation film on a silicon substrate via a resist mask substantially to a depth less than a thickness thereof by using an etching gas containing a fluorocarbon compound and an oxyhalogen compound having a molecule with a halogen atom and at least one kind of functional group selected from the group consisting of carbonyl, thionyl, sulfuryl, nitrosyl, and nitryl, said fluorocarbon compound shown by a general formula $C_mF_n$, with m and n being natural numbers showing the number of atoms and satisfying conditions of $m \geq 2$, $n \leq 2m+2$, and an overetching process for plasma etching a remaining portion of said silicon compound layer by using an etching gas with a higher content ratio of said oxyhalogen compound to said fluorocarbon compound than in said first plasma etching process.

11. A dry etching method comprising the steps of plasma etching process for etching a silicon compound layer on a substrate substantially to a depth less than a thickness thereof by using an etching gas containing a fluorocarbon compound and a halogen compound having a molecule with a halogen atom and at least one kind of functional group selected from the group consisting of carbonyl, thionyl, sulfuryl, nitrosyl, and nitryl, and an overetching process for plasma etching a remaining portion of said silicon compound layer by using an etching gas containing a sulfur based compound capable of releasing sulfur in a plasma on dissociation by electric discharges and depositing a sulfur based deposit at least on a part of a surface to be etched.

12. The dry etching method as claimed in claim 11 wherein said halogen compound is at least one kind of oxyhalogen compound selected from carbonyl fluoride, carbonyl chloride, carbonyl bromide, oxalyl fluoride, oxalyl chloride, oxalyl bromide, thionyl fluoride, thionyl chloride, thionyl bromide, sulfuryl fluoride, sulfuryl chloride, sulfuryl bromide, nitrosyl fluoride, nitrosyl chloride, nitrosyl bromide, nitryl fluoride, nitryl chloride, and nitryl bromide.

13. The dry etching method as claimed in claim 11 wherein said fluorocarbon compound is shown by a general formula $C_mF_n$, with m and n being natural numbers showing the number of atoms and satisfying conditions of $m \geq 2$, $n \leq 2m+2$.

14. The dry etching method as claimed in claim 11 wherein said sulfur based compound is at least one kind of sulfur fluoride selected from the group consisting of $S_2F_2$, $SF_2$, $SF_4$, and $S_2F_{10}$.

15. The dry etching method as claimed in claim 11 wherein said sulfur based deposit is a material selected from a group consisting of sulfur sulfur nitride based compound and a mixture thereof.

16. The dry etching method as claimed in claim 11 wherein said sulfur based deposit deposited on the surface to be etched is removed by heating said substrate after completion of said overetching process.

17. A dry etching method comprising the steps of a plasma etching process for etching a silicon oxide interlayer insulation film on a silicon substrate via a resist mask substantially to a depth less than a thickness thereof by using an etching gas containing a fluorocarbon compound and an oxyhalogen compound having a molecule with a halogen atom and at least one kind of functional group selected from the group consisting of carbonyl, thionyl, sulfuryl, nitrosyl, and nitryl, said fluorocarbon compound shown by a general formula $C_mF_n$, with m and n being natural numbers showing the number of atoms and satisfying conditions of $m \geq 2$, $n \leq 2m+2$, an overetching process for plasma etching a remaining portion of said silicon based compound layer by using an etching gas containing at least one kind of sulfur fluoride selected from the group consisting of $S_2F_2$, $SF_2$, $SF_4$, and $S_2F_{10}$, and said sulfur fluoride depositing a sulfur based deposit on a part of a surface to be etched, and a process of removing said sulfur based deposit.

18. The dry etching method as claimed in claim 17 wherein said sulfur based deposit is removed by heating said silicon substrate.

19. The dry etching method as claimed in claim 17 wherein said sulfur based deposit is removed at the same time when said resist mask is removed by washing.

* * * * *